(12) United States Patent
Cho et al.

(10) Patent No.: US 9,627,731 B2
(45) Date of Patent: Apr. 18, 2017

(54) RESONANCE DEVICE AND FILTER INCLUDING THE SAME

(71) Applicant: Innertron, Inc., Incheon (KR)

(72) Inventors: Hak Rae Cho, Bucheon-si (KR); Soo Duk Seo, Incheon (KR); Jeong Pyo Kim, Seoul (KR)

(73) Assignee: INNERTRON, INC., Incheon (KR)

(*) Notice: Subject to any disclaimer, the term of this patent is extended or adjusted under 35 U.S.C. 154(b) by 46 days.

(21) Appl. No.: 14/725,237

(22) Filed: May 29, 2015

(65) Prior Publication Data

US 2016/0336917 A1    Nov. 17, 2016

(30) Foreign Application Priority Data

May 15, 2015    (KR) .................. 10-2015-0067935

(51) Int. Cl.
*H01P 1/203*    (2006.01)
*H03H 7/01*    (2006.01)
*H01P 3/08*    (2006.01)
*H02N 1/00*    (2006.01)
*H03H 9/24*    (2006.01)
(Continued)

(52) U.S. Cl.
CPC ...... *H01P 1/20345* (2013.01); *H01P 1/20336* (2013.01); *H01P 3/082* (2013.01); *H02N 1/006* (2013.01); *H03H 7/0115* (2013.01); *H03H 9/24* (2013.01); *H03H 9/46* (2013.01); *H03H 2001/0085* (2013.01)

(58) Field of Classification Search
CPC .......... H03H 2001/0085; H03H 7/0115; H01P 1/203; H01P 3/08; H01P 3/082; H01P 1/20345

USPC ........................ 333/175, 185, 204
See application file for complete search history.

(56) References Cited

U.S. PATENT DOCUMENTS

| | | | | |
|---|---|---|---|---|
| 5,484,764 A | * | 1/1996 | Fiediuszko | ......... H01P 1/20381 333/202 |
| 5,521,564 A | * | 5/1996 | Kaneko | ............... H01P 1/20372 333/175 |

(Continued)

FOREIGN PATENT DOCUMENTS

| | | |
|---|---|---|
| EP | 0343345 | 11/1989 |
| GB | 2289167 | 11/1995 |

(Continued)

OTHER PUBLICATIONS

European Search Report—European Application No. 15169766.1, issued on Oct. 17, 2016, citing US 2014/306782, Kim, et al., US 2001/020880, GB 2 289 167, JP 2014 049867 and EP 0 343 345.

(Continued)

*Primary Examiner* — Stephen E Jones
*Assistant Examiner* — Rakesh Patel
(74) *Attorney, Agent, or Firm* — Cantor Colburn LLP

(57) ABSTRACT

A resonance device and a filter including the same are provided. The resonance device includes a case having a first ground surface and a second ground surface which are facing each other, and a first conductive layer located in the case, and the first conductive layer includes a main part grounded via the first ground surface, and a protruding part which has a width different from that of the main part and is located to be spaced apart from the second ground surface.

6 Claims, 12 Drawing Sheets

(51) Int. Cl.
*H03H 9/46* (2006.01)
*H03H 1/00* (2006.01)

(56) References Cited

U.S. PATENT DOCUMENTS

| | | | |
|---|---|---|---|
| 6,294,967 B1* | 9/2001 | Hirai | H01P 1/20345 333/202 |
| 2001/0020880 A1 | 9/2001 | Muzutani et al. | |
| 2007/0205851 A1* | 9/2007 | Fukunaga | H01P 1/20345 333/204 |
| 2014/0306782 A1 | 10/2014 | Cho et al. | |

FOREIGN PATENT DOCUMENTS

| JP | 04043703 | 2/1992 |
|---|---|---|
| JP | 08008605 | 1/1996 |
| JP | 2002252509 | 9/2002 |
| JP | 2002368502 | 12/2002 |
| JP | 2014049867 | 3/2014 |
| KR | 1020100048862 | 5/2010 |
| KR | 101430684 | 8/2014 |

OTHER PUBLICATIONS

Kim, et al., Varactor-Tuned Combline Bandpass Filter Using Step-Impedance Microstrip Lines, IEEE Transactions on Microwave Theory and Techniques, vol. 52, No. 4, Apr. 2004, pp. 1279-1283.
Korean Office Action—Korean Application No. 10-2015-0067935 issued on Aug. 9, 2016, citing KR 10-1430684 and Lee.
Lee, Compact Microwave Microstrip Resonator Bandpass Filters for Communication, A Thesis submitted for the degree of Doctor of Philosophy at Faculty of Engineering, Computing and Science Swinburne University of Technology, 2014.
Japanese Office Action—Japanese Application No. 2015-244668 issued on Dec. 13, 2016, citing JP 2002-368502, JP 8-8605, Makimoto, et al. JP 4-43703 and JP 2002-252509.
Makimoto, et al., Design Method of Stepped Impedance Resonator in the UHF band, Technical research report of the Society of Electronic Communications, vol. 79, Jul. 23, 1979, pp. 15-22.

* cited by examiner

RESONANCE DEVICE AND FILTER INCLUDING THE SAME

BACKGROUND

1. Technical Field

Exemplary embodiments of the present invention relate to a resonance device, and more particularly, to a resonance device including a conductive layer configured as a main part and a protruding part having a width different from that of the main part, and a filter including the same.

2. Description of the Related Art

Various types of filters are used in a communication system. Filters are devices for performing a function of passing only a signal of a specific frequency band, and are classified as a low pass filter (LPF), a band pass filter (BPF), a high pass filter (HPF), and a band stop filter (BSF), etc. according to a frequency band which is filtered.

Further, the filters may be classified as an LC filter, a transmission line filter, a cavity filter, a dielectric resonator (DR) filter, a ceramic filter, a coaxial filter, a waveguide filter, a surface acoustic wave (SAW) filter, etc. according to a manufacturing method and an element used in the filter.

A resonator having a high Q-factor is required in order to simultaneously implement narrowband characteristics and excellent blocking characteristics in the filter. In this case, the resonator is largely implemented in the form of a printed circuit board (PCB), a dielectric resonator, or a monoblock.

Conventional Art

Patent

Korean Patent Publication No. 10-2010-0048862 (Publication date: May 11, 2010)

SUMMARY

The present invention is directed to a resonance device including a conductive layer configured as a main part and a protruding part having a width different from that of the main part, and a filter including the same.

According to one aspect of the present invention, there is provided a resonance device, including: a case having a first ground surface and a second ground surface which are facing each other; and a first conductive layer located in the case, wherein the first conductive layer includes a main part grounded via the first ground surface, and a protruding part which has a width different from that of the main part and is located to be spaced apart from the second ground surface.

According to an embodiment, characteristics of the resonance device may be determined according to a width and a protruding length of the protruding part, and a distance between the protruding part and the second ground surface.

According to an embodiment, the resonance device may further include a first stacked layer which is grounded via the second ground surface, is spaced apart from the first conductive layer, and is disposed above the first conductive layer.

According to an embodiment, the first stacked layer may have an overlapping area which is overlapped in a direction spaced apart from each of the main part and the protruding part.

According to an embodiment, the resonance device may further include a second stacked layer which is grounded via the second ground surface, is spaced apart from the first conductive layer, and is disposed below the first conductive layer.

According to an embodiment, the second stacked layer may have an overlapping area which is overlapped in a direction spaced apart from each of the main part and the protruding part.

According to an embodiment, the resonance device may further include a second conductive layer which is grounded via the first ground surface, has the same structure as the first conductive layer, and is disposed between the first conductive layer and the second stacked layer, wherein the protruding part of the first conductive layer and the protruding part of the second conductive layer are connected by a via.

According to an embodiment, the resonance device may further include: a third stacked layer which is not grounded via the second ground surface, is disposed above the first stacked layer, and is connected to the protruding part of the first conductive layer by a first via; and a fourth stacked layer which is not grounded via the second ground surface, is disposed below the second stacked layer, and is connected to the protruding part of the first conductive layer by a second via.

According to another aspect of the present invention, there is provided a band pass filter including the resonance device.

According to still another aspect of the present invention, there is provided a resonance device, including: a case having a first ground surface and a second ground surface which are facing each other; and a plurality of conductive layers located in the case, and spaced apart from each other, wherein the first conductive layer includes a main part grounded via the first ground surface, and a protruding part which has a width different from that of the main part and is located to be spaced apart from the second ground surface.

BRIEF DESCRIPTION OF DRAWINGS

In order to understand the drawings cited in the detailed description of the present invention more fully, a detailed description of each drawing is provided, in which.

DETAILED DESCRIPTION OF EMBODIMENTS

Figure 1:
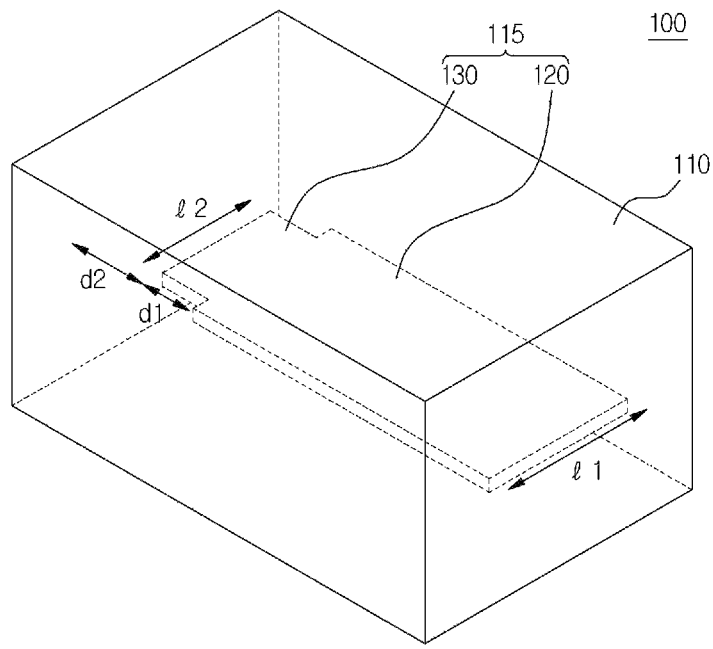
FIG. 1 is a perspective view of a resonance device according to one embodiment of the present invention.

While a specific structural or functional description with respect to embodiments according to the present invention disclosed in this specification is merely provided for the purpose of describing the embodiments of the present invention, there are various modifications capable of replacing the embodiments, and the present invention is not limited to the embodiments described in this specification.

While the embodiments according to the present invention is susceptible to various modifications and alternative forms, specific embodiments thereof are shown by way of examples in the drawings and will herein be described in detail. It should be understood, however, that there is no intent to limit the present invention to the particular forms disclosed, but on the contrary, the present invention is to cover all modifications, equivalents, and alternatives falling within the spirit and scope of the invention.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, it will be understood that when an element is referred to as being "directly connected" or "directly coupled" to another element, there are no intervening elements present. Other expressions describing a relation between elements, that is, "~between" and "directly~between", or "adjacent to~" and "directly adjacent to~", etc. should be similarly understood.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
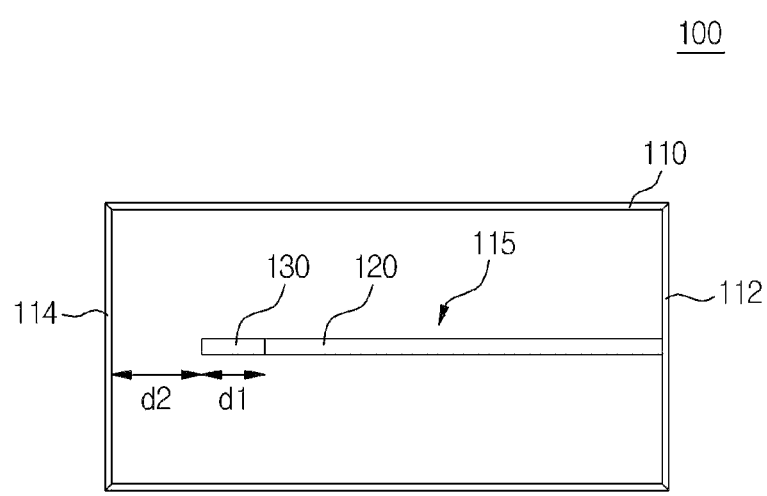
FIG. 2 is a cross-sectional view of a resonance device shown in FIG. 1.

FIG. 1 is a perspective view of a resonance device according to one embodiment of the present invention. FIG. 2 is a cross-sectional view of a resonance device shown in FIG. 1.

Referring to FIGS. 1 and 2, a resonance device 100 may include a case 110, and a first conductive layer 115 located in the case.

For convenience of explanation, the case 110 is illustrated in a rectangular shape in FIG. 1, but is not limited thereto.

The case 110 may include a first ground surface 112 and a second ground surface 114 which are facing each other. According to one embodiment, every surface including the first ground surface 112 and the second ground surface 114 of the case 110 may be conductive. According to another embodiment, some of the remaining surfaces excluding the first ground surface 112 and the second ground surface 114 of the case 110 may be conductive.

The case 110 which is conductive may be configured so that the first conductive layer 115 formed in the case 110 is not influenced by an outside environment. That is, a problem in which the outside environment has an influence on operational characteristics of the first conductive layer 115 of the case 110 may be prevented by shielding an electromagnetic wave capable of being generated due to a current flow of another peripheral element or circuit.

According to an embodiment, the inside of the resonance device 100, that is, an empty space in the case 110, may be filled with a dielectric, for example, a ceramic.

The first conductive layer 115 may include a main part 120 and a protruding part 130.

One side of the main part 120 may be grounded via the first ground surface 112, and the other side of the main part 120 may be connected to the protruding part 130.

For convenience of explanation, an example in which the main part 120 and the protruding part 130 are distinguishable is illustrated in FIG. 1, however, the main part 120 and the protruding part 130 may be implemented by the same material in a form in which they are not distinguishable.

The protruding part 130 may have a width l2 different from a width l1 of the main part 120, and may be located to be spaced apart from the second ground surface 114.

Since the width l2 of the protruding part 130 is implemented to be narrower than the width l1 of the main part 120, a portion facing between the second ground surface 114 and the first conductive layer 115 may be also narrow.

Accordingly, when changing a shape of the protruding part 130 facing the second ground surface, sensitivity of the change in characteristics of the resonance device 100 may be decreased compared with when changing a shape of the main part 120 without the protruding part 130.

That is, the resonance device 100 according to one embodiment of the present invention can more precisely adjust and design characteristics of the resonance device 100 by adjusting the width l2 and a protruding length d1 of the protruding part 130 and a distance d2 between the protruding part 130 and the second ground surface.

According to an embodiment, the characteristics of the resonance device 100 may include a center frequency, a bandwidth, a quality factor (Q), etc. of the resonance device 100.

Figure 3:
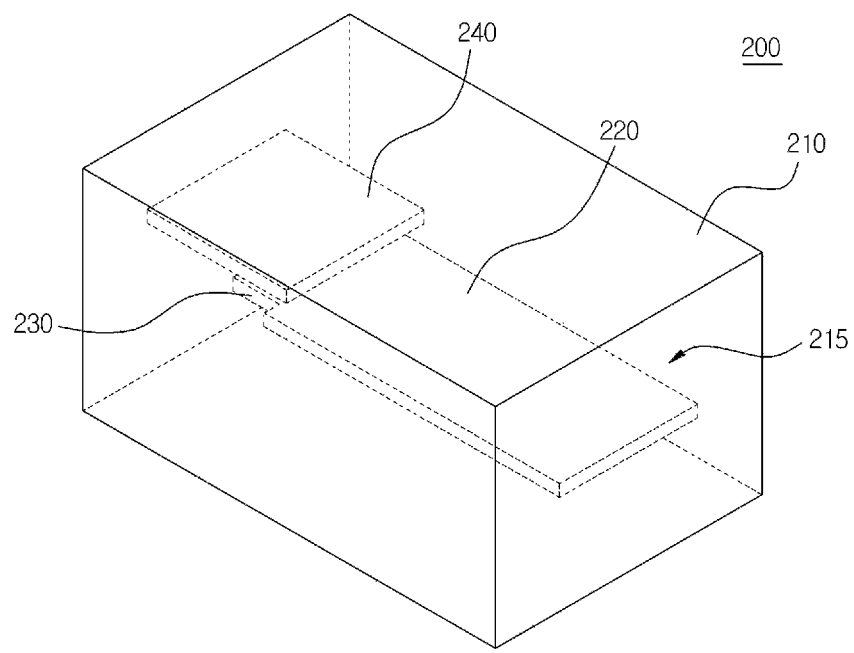
FIG. 3 is a perspective view of a resonance device according to another embodiment of the present invention.
Figure 4:
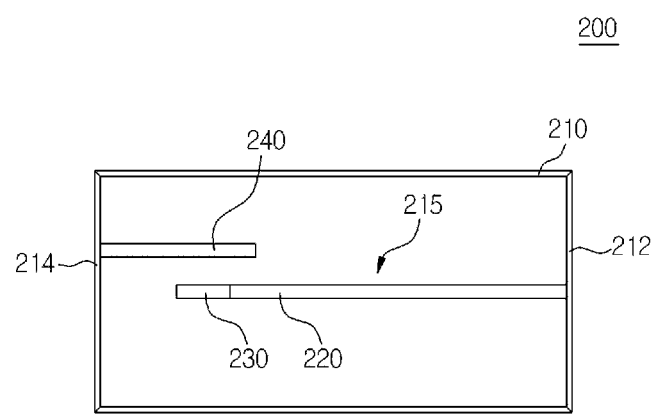
FIG. 4 is a cross-sectional view of a resonance device shown in FIG. 3.

FIG. 3 is a perspective view of a resonance device according to another embodiment of the present invention. FIG. 4 is a cross-sectional view of a resonance device shown in FIG. 3.

Referring to FIGS. 3 and 4, a resonance device 200 according to another embodiment of the present invention may include a first conductive layer 215 and a first stacked layer 240 in a case 210.

The first conductive layer 215 of FIG. 3 may substantially have the same structure as the first conductive layer 115 of FIG. 1.

The first stacked layer 240 may be spaced apart from the first conductive layer 215, disposed above the first conductive layer 215, and grounded via a second ground surface.

The first stacked layer 240 may have an overlapping area which is overlapped in a direction spaced apart from each of a protruding part 230 and a main part 220 of the first conductive layer 215, for example, in a vertical direction.

Figure 5:
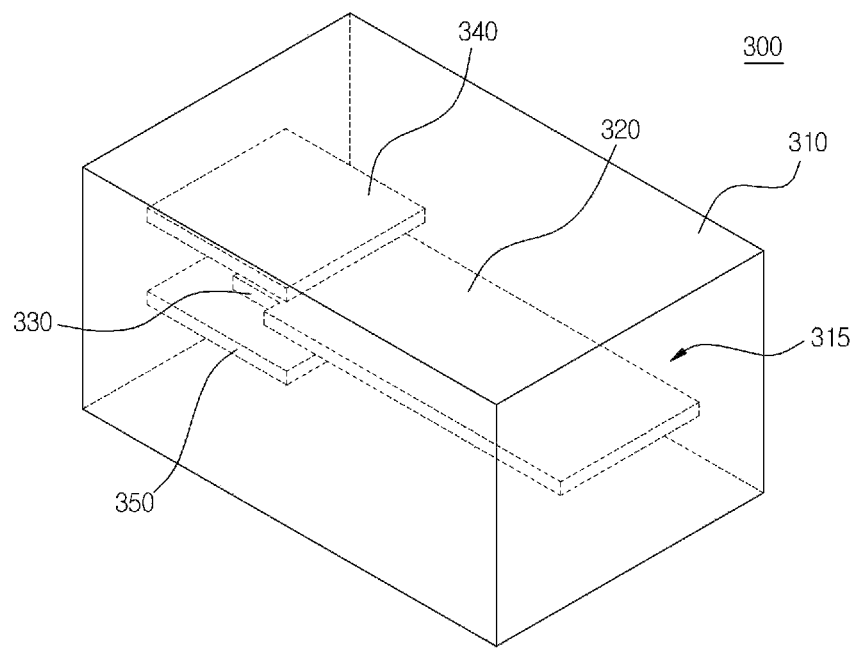
FIG. 5 is a perspective view of a resonance device according to still another embodiment of the present invention.
Figure 6:
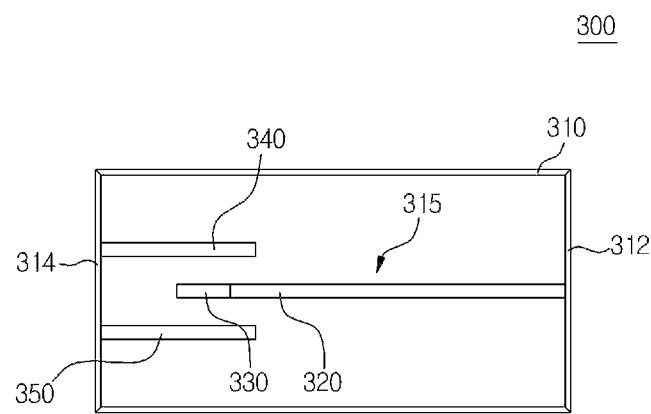
FIG. 6 is a cross-sectional view of a resonance device shown in FIG. 5.

FIG. 5 is a perspective view of a resonance device according to still another embodiment of the present invention. FIG. 6 is a cross-sectional view of a resonance device shown in FIG. 5.

Referring to FIGS. 5 and 6, a resonance device 300 according to still another embodiment of the present invention may include a first conductive layer 315, a first stacked layer 340, and a second stacked layer 350 in a case 310.

Each of the first conductive layer 315 and the first stacked layer 340 of FIG. 5 may substantially have the same structure as each of the first conductive layer 215 and the first stacked layer 240 of FIG. 3.

The second stacked layer 350 may be spaced apart from the first conductive layer 315, disposed below than the first conductive layer 315, and grounded via the second ground surface 350.

The second stacked layer 350 may have an overlapping area which is overlapped in a direction spaced apart from each of the protruding part 330 and the main part 320 of the first conductive layer 315, for example, in a vertical direction.

Figure 7:
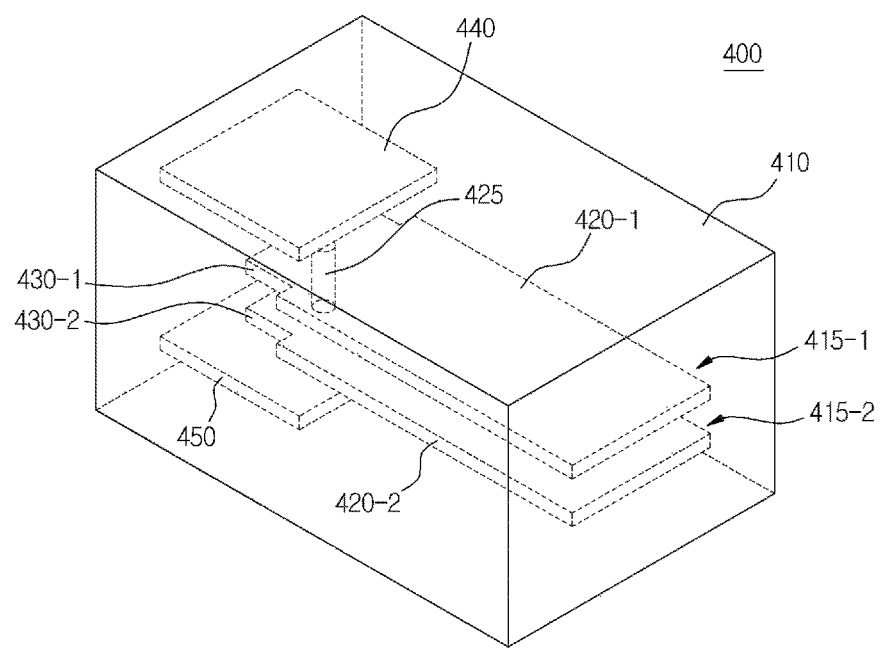
FIG. 7 is a perspective view of a resonance device according to yet another embodiment of the present invention.
Figure 8:
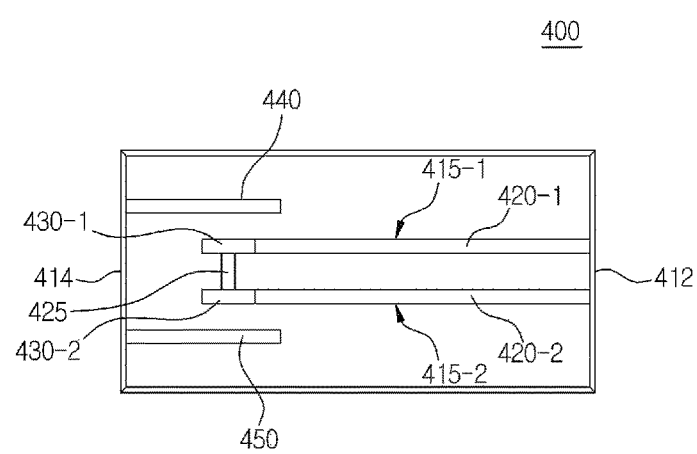
FIG. 8 is a cross-sectional view of a resonance device shown in FIG. 7.

FIG. 7 is a perspective view of a resonance device according to yet another embodiment of the present invention. FIG. 8 is a cross-sectional view of a resonance device shown in FIG. 7.

Referring to FIGS. 7 and 8, a resonance device 400 according to yet another embodiment of the present invention may include a first conductive layer 415-1, a second conductive layer 415-2, a first stacked layer 440, and a second stacked layer 450 in a case 410.

Each of the first conductive layer 415-1 and the second conductive layer 415-2 of FIG. 7 may substantially have the same structure as the first conductive layer 115 of FIG. 1, and each of the first conductive layer 415-1 and the second conductive layer 415-2 may be grounded via a first ground surface 412.

Further, a protruding part 430-1 of the first conductive layer 415-1 and a protruding part 430-2 of the second conductive layer 415-2 may be connected through a via 425.

The first stacked layer 440 may be spaced apart from the first conductive layer 415-1, disposed above the first conductive layer 415-1, and grounded via a second ground surface 414.

The second stacked layer 450 may be spaced apart from the second conductive layer 415-2, disposed below than the second conductive layer 415-2, and grounded via the second ground surface 414.

Figure 9:
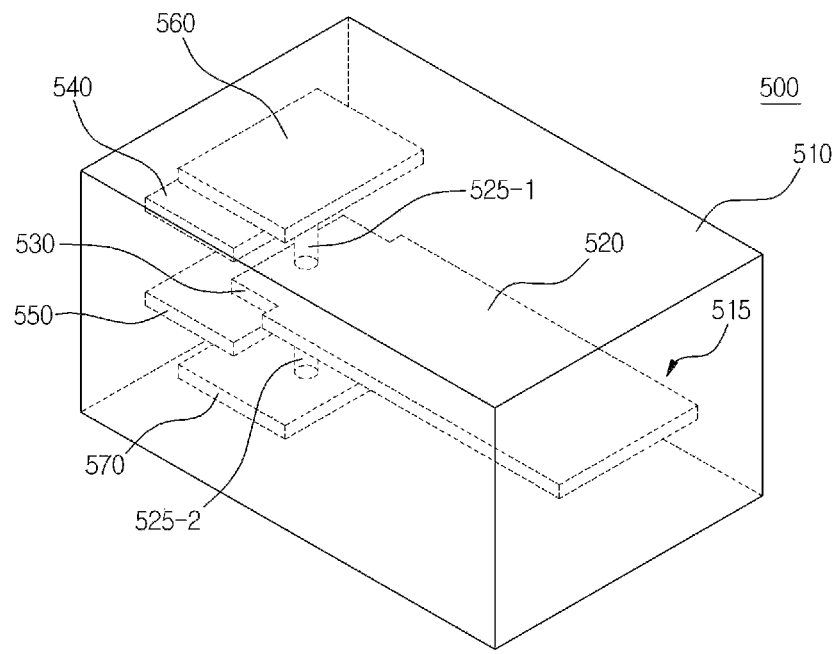
FIG. 9 is a perspective view of a resonance device according to yet another embodiment of the present invention.
Figure 10:
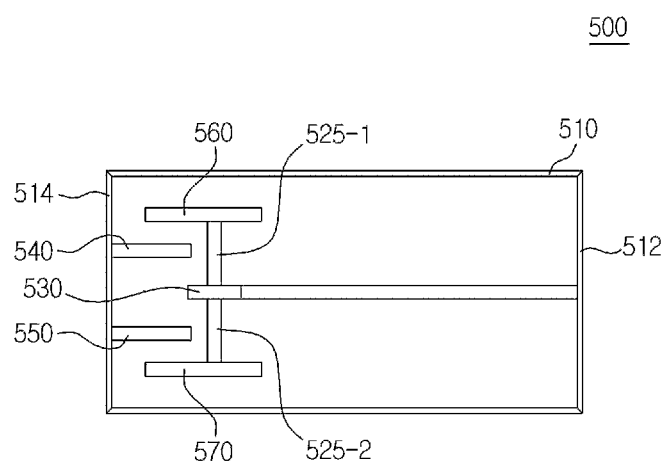
FIG. 10 is a cross-sectional view of a resonance device shown in FIG. 9.

FIG. 9 is a perspective view of a resonance device according to yet another embodiment of the present invention. FIG. 10 is a cross-sectional view of a resonance device shown in FIG. 9.

Referring to FIGS. 9 and 10, a resonance device 500 according to yet another embodiment of the present invention may include a first conductive layer 515, a first stacked layer 540, a second stacked layer 550, a third stacked layer 560, and a fourth stacked layer 570 in a case 510.

The first conductive layer 515 of FIG. 9 may substantially have the same structure as the first conductive layer 115 of FIG. 1.

The first stacked layer 540 may be spaced apart from the first conductive layer 515, disposed above the first conductive layer 515, and grounded via a second ground surface 540.

The first stacked layer 540 may have an overlapping area which is overlapped in a direction spaced apart from a protruding part 530 of the first conductive layer 515, for example, in a vertical direction.

The second stacked layer 550 may be spaced apart from the first conductive layer 515, disposed below than the first conductive layer 515, and grounded via the second ground surface 540.

The second stacked layer 550 may have an overlapping area which is overlapped in a direction spaced apart from the protruding part 530 of the first conductive layer 515, for example, in a vertical direction.

The third stacked layer 560 may not be grounded via the second ground surface 514, may be spaced apart from the first stacked layer 540, and may be disposed above the first stacked layer 540.

The third stacked layer 560 may be connected to the protruding part 530 of the first conducive layer 515 through a first via 525-1.

The fourth stacked layer 570 may not be grounded in the second ground surface 514, may be spaced apart from the second stacked layer 550, and may be disposed below the second stacked layer 550.

The fourth stacked layer 570 may be connected to the protruding part 530 of the first conductive layer 515 through a second via 525-2.

Figure 11:
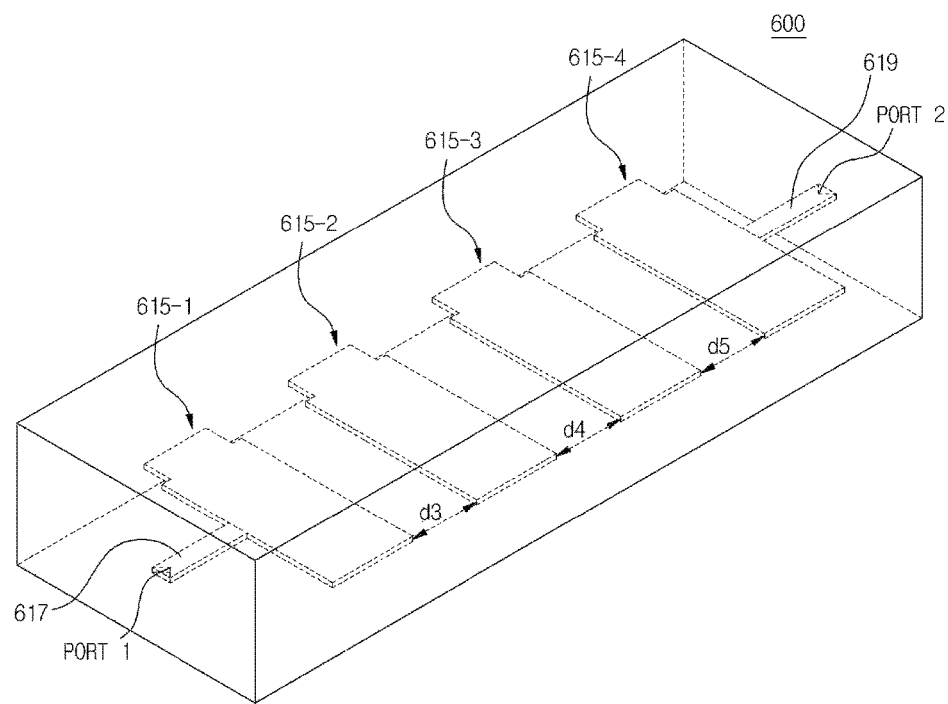
FIG. 11 is a perspective view of a resonance device according to yet another embodiment of the present invention.
Figure 12:
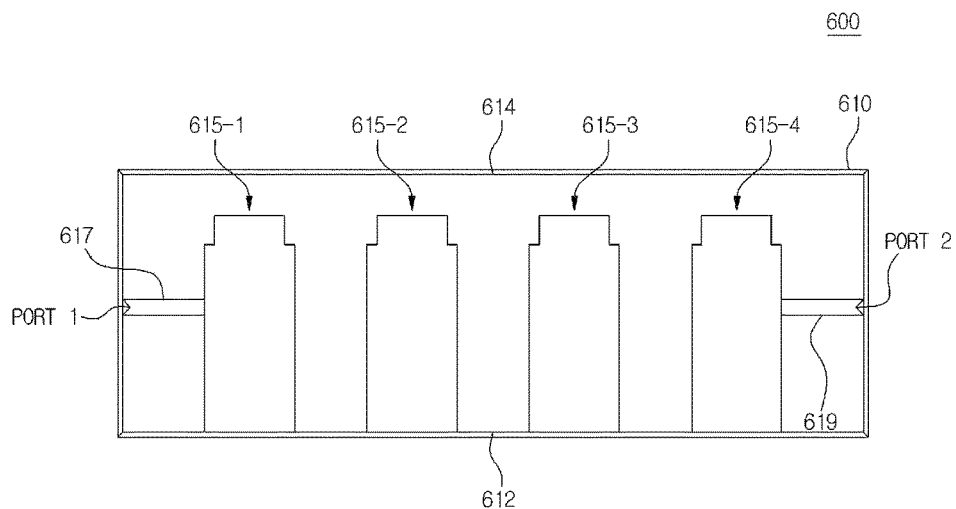
FIG. 12 is a cross-sectional view of a resonance device shown in FIG. 11.

FIG. 11 is a perspective view of a resonance device according to yet another embodiment of the present invention. FIG. 12 is a cross-sectional view of a resonance device shown in FIG. 11.

Referring to FIGS. 11 and 12, each of a plurality of layers 615-1 to 615-4 included in a case 610 of a resonance device 600 may substantially have the same structure as the conductive layer 115 of FIG. 1.

The plurality of conductive layers 615-1 to 615-4 may be spaced apart from each other, the conductive layer (for example, 615-1) of one end may be connected to a first port PORT1 through an input layer 617, and the conductive layer (for example, 615-4) of the other end may be connected to a second port PORT2 of an output layer 619.

The first port PORT1 and the second port PORT2 may refer to an input port and an output port, respectively.

Characteristics of the resonance device 600 may be additionally adjusted by distances d3, d4, and d5 in which the plurality of conductive layers 615-1 to 615-4 are spaced apart from each other in addition to a shape of the protruding part of each of the plurality of conductive layers 615-1 to 615-4.

Accordingly, since the resonance device 600 includes the plurality of conductive layers 615-1 to 615-4, it may be easy to design a wideband filter.

Figure 13:
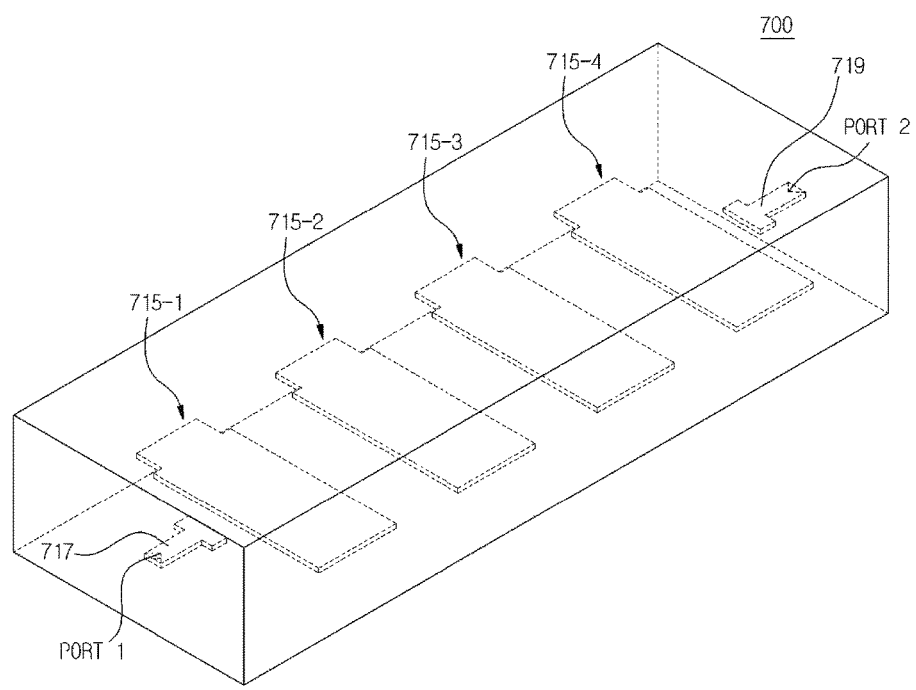
FIG. 13 is a perspective view of a resonance device according to yet another embodiment of the present invention.
Figure 14:
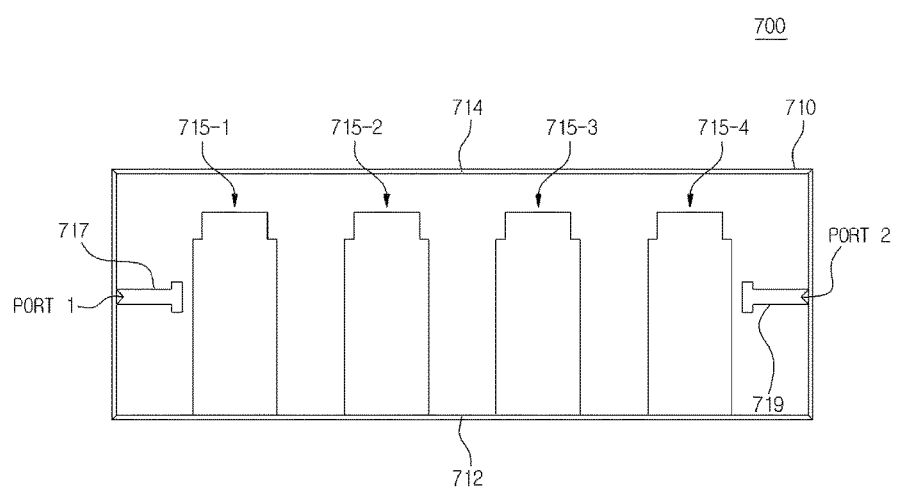
FIG. 14 is a cross-sectional view of a resonance device shown in FIG. 13.

FIG. 13 is a perspective view of a resonance device according to yet another embodiment of the present invention. FIG. 14 is a cross-sectional view of a resonance device shown in FIG. 13.

Referring to FIGS. 13 and 14, each of a plurality of conductive layers 715-1 to 715-4 included in a case 710 of a resonance device 700 may substantially have the same structure as the conductive layer 115 of FIG. 1.

The plurality of conductive layers 715-1 to 715-4 may be spaced apart from each other, the conductive layer (for example, 715-1) of one end may be disposed to be spaced apart from an input layer 717 connected to a first port PORT1, and the conductive layer (for example, 715-4) of the other end may be disposed to be spaced apart from an output layer 719 connected to a second port PORT2.

Figure 15:
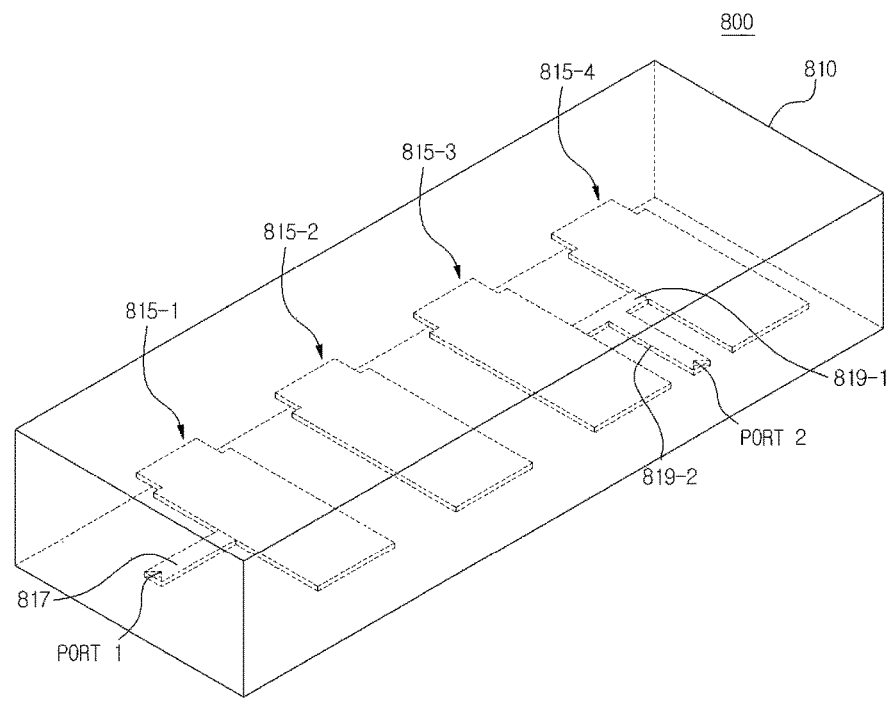
FIG. 15 is a perspective view of a resonance device according to yet another embodiment of the present invention.
Figure 16:
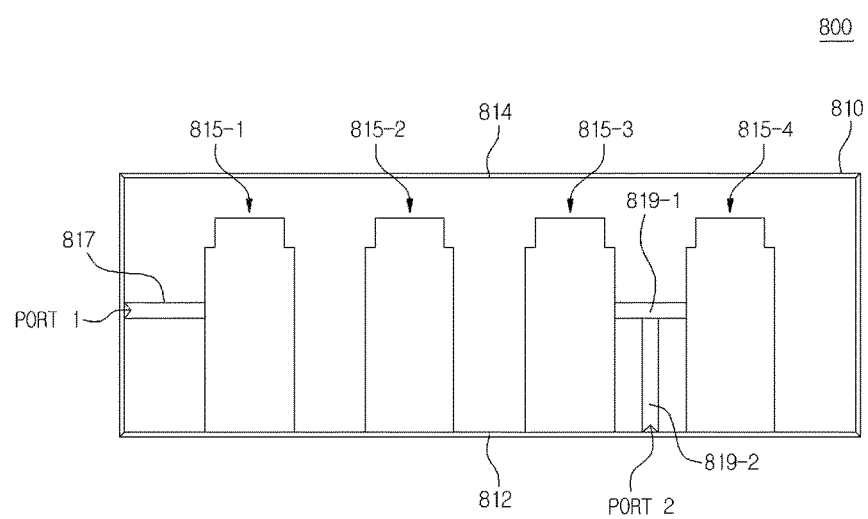
FIG. 16 is a cross-sectional view of a resonance device shown in FIG. 15.

FIG. 15 is a perspective view of a resonance device according to yet another embodiment of the present invention. FIG. 16 is a cross-sectional view of a resonance device shown in FIG. 15.

Referring to FIGS. 15 and 16, each of a plurality of conductive layers 815-1 to 815-4 included in a case 810 of a resonance device 800 may substantially have the same structure as the conductive layer 115 of FIG. 1.

The conductive layer 815-3 and the conductive layer 815-4 may be connected by a bridge 819-1. The bridge 819-1 may be connected to the main part of the conductive layer 815-3 and the main part of the conductive layer 815-4.

The bridge 819-1 may be connected to a second port PORT2 through an output layer 819-2.

In this case, the conductive layer 815-4 may operate as a notch resonator, and frequency selectivity of one end of a pass band of the resonance device 800 may be increased.

Figure 17:
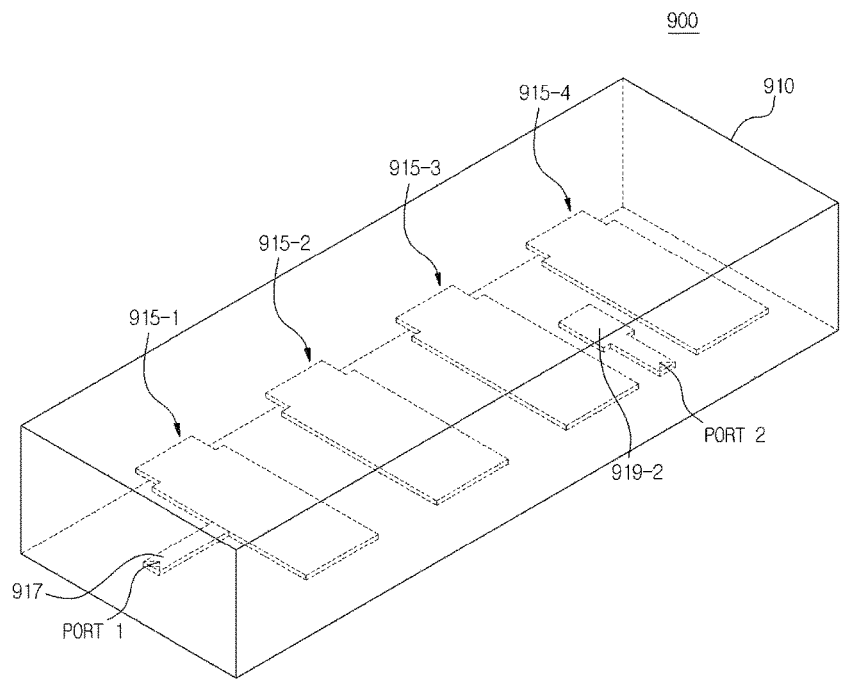
FIG. 17 is a perspective view of a resonance device according to yet another embodiment of the present invention.
Figure 18:
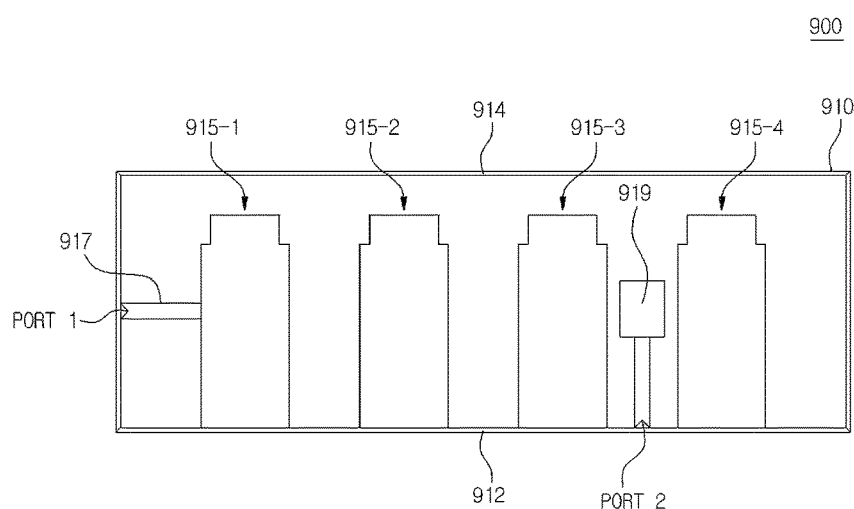
FIG. 18 is a cross-sectional view of a resonance device shown in FIG. 17.

FIG. 17 is a perspective view of a resonance device according to yet another embodiment of the present invention. FIG. 18 is a cross-sectional view of a resonance device shown in FIG. 17.

Referring to FIGS. 17 and 18, each of a plurality of conductive layers 915-1 to 915-4 included in a case 910 of a resonance device 900 may substantially have the same structure as the conductive layer 115 of FIG. 1.

Each of the conductive layer 915-3 and the conductive layer 915-4 may be disposed to be spaced apart from an output layer 919 connected to a second port PORT2.

Figure 19:
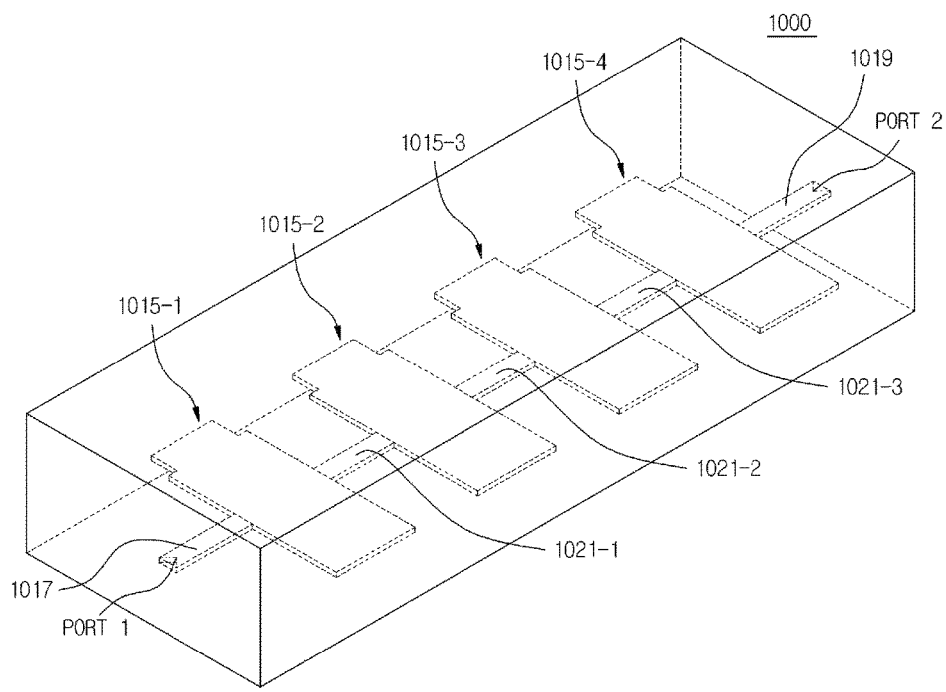
FIG. 19 is a perspective view of a resonance device according to yet another embodiment of the present invention.
Figure 20:
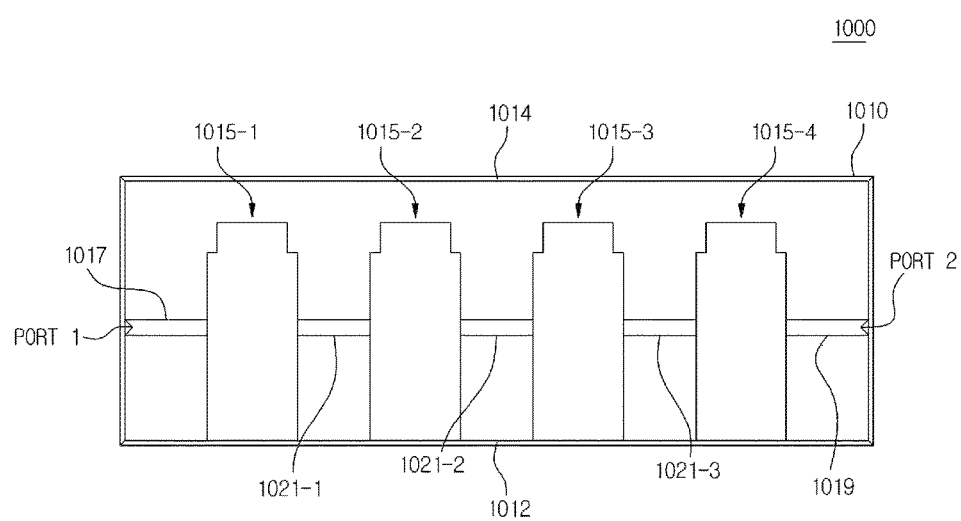
FIG. 20 is a cross-sectional view of a resonance device shown in FIG. 19.

FIG. 19 is a perspective view of a resonance device according to yet another embodiment of the present invention. FIG. 20 is a cross-sectional view of a resonance device shown in FIG. 19.

Referring to FIGS. 19 and 20, each of a plurality of conductive layers 1015-1 to 1015-4 included in a case 1010 of a resonance device 1000 may substantially have the same structure as the conductive layer 115 of FIG. 1.

Bridge layers 1021-1 to 1021-3 may be connected between the plurality of conductive layers 1015-1 to 1015-4.

Accordingly, inductance values between the plurality of conductive layers 1015-1 to 1015-4 may be increased, and there may be an advantage of being able to design a bandwidth of the resonance device 100 more widely.

Figure 21:
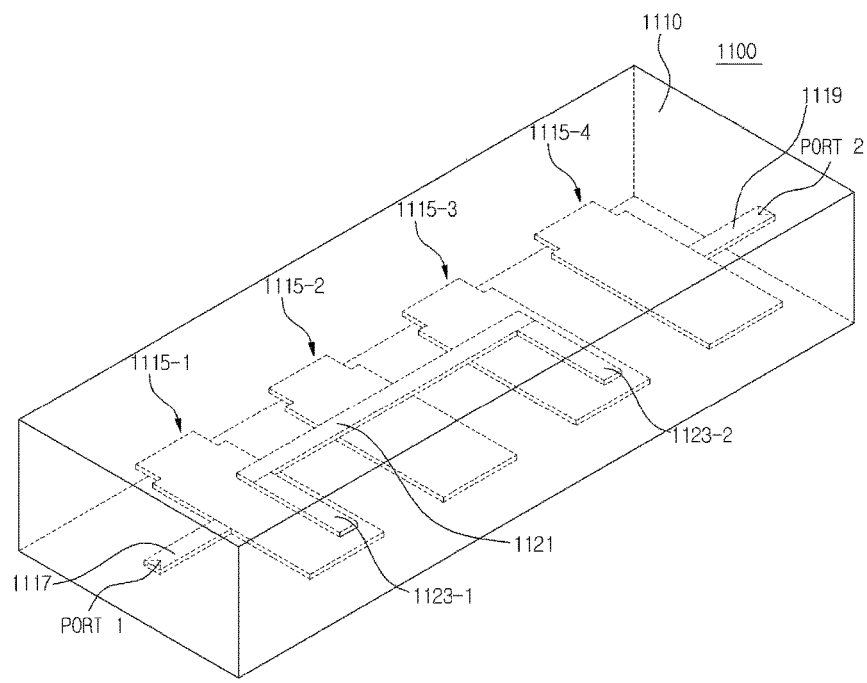
FIG. 21 is a perspective view of a resonance device according to yet another embodiment of the present invention.
Figure 22:
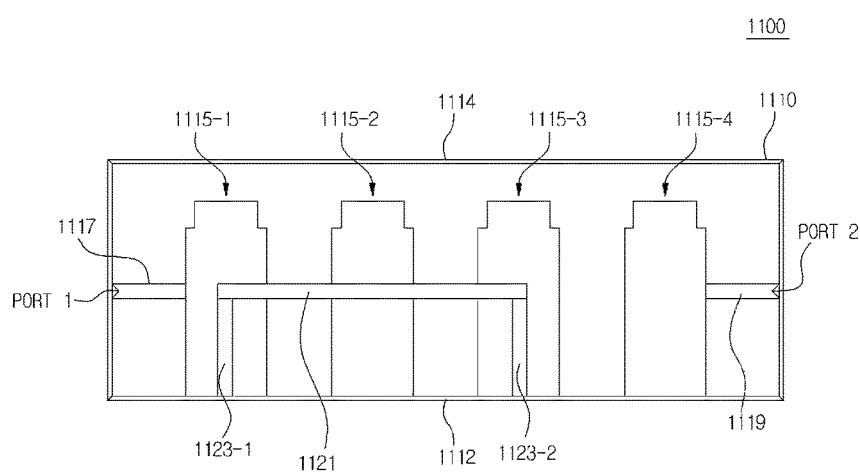
FIG. 22 is a cross-sectional view of a resonance device shown in FIG. 21.

FIG. 21 is a perspective view of a resonance device according to yet another embodiment of the present invention. FIG. 22 is a cross-sectional view of a resonance device shown in FIG. 21.

Referring to FIGS. 21 and 22, each of a plurality of conductive layers 1115-1 to 1115-4 included in a case 1110 of a resonance device 1100 may substantially have the same structure as the conductive layer 115 of FIG. 1.

The resonance device 1100 may include a crossing layer 1121 having an overlapping area which overlaps at least three conductive layers (for example, 1115-1 to 1115-3), and a plurality of short-ended layers 1123-1 and 1123-2 connecting the crossing layer 1121 and a first ground surface 1112.

The crossing layer 1121 and the plurality of short-ended layers 1123-1 and 1123-2 may be spaced apart from the conductive layers (for example, 1115-1 to 1115-3) in a vertical direction.

The resonance device 1100 may increase frequency selectivity of a high frequency side among the pass band by adding a parallel inductance component through the crossing layer 1121 and the plurality of short-ended layers 1123-1 and 1123-2.

Figure 23:
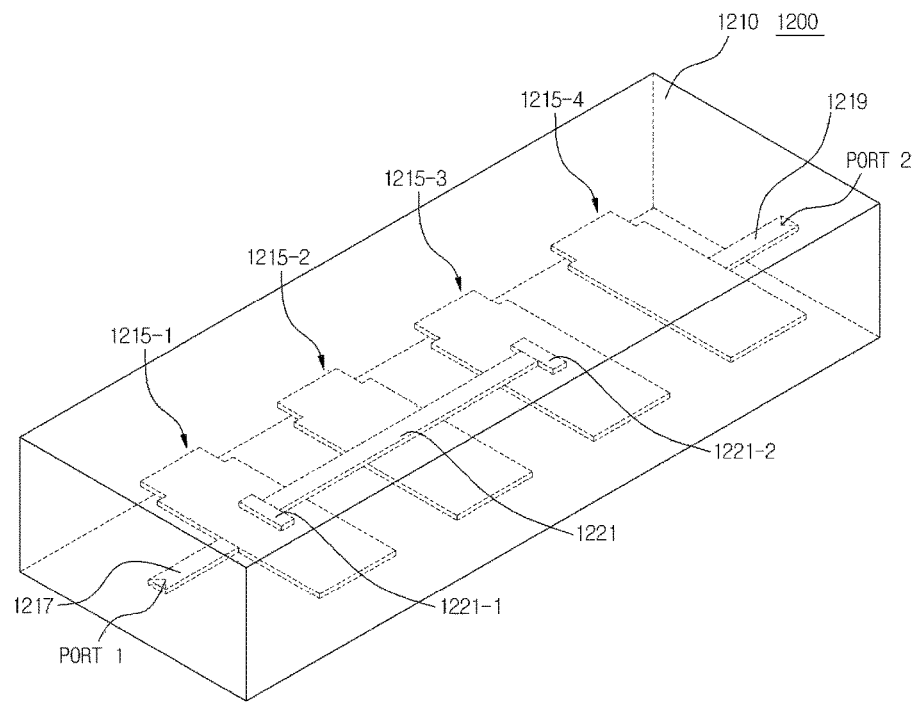
FIG. 23 is a perspective view of a resonance device according to yet another embodiment of the present invention.
Figure 24:
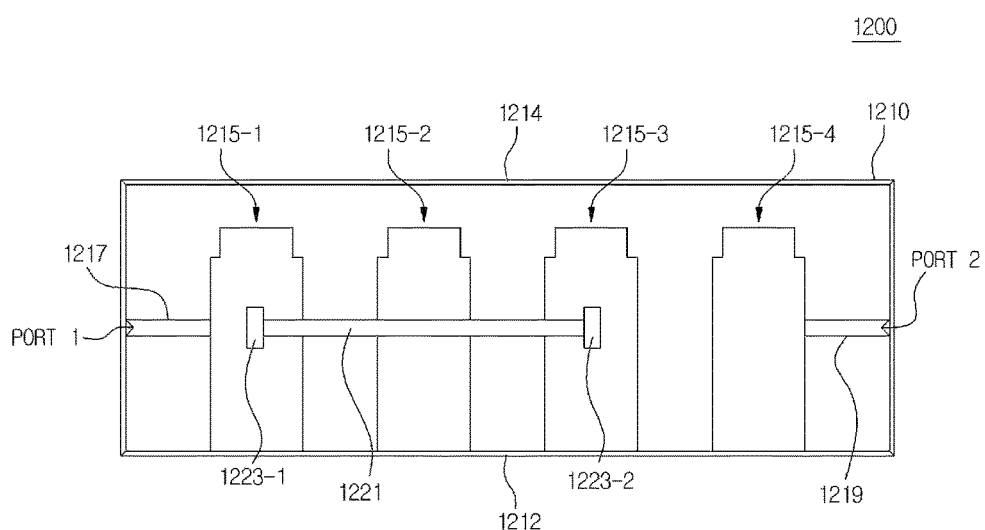
FIG. 24 is a cross-sectional view of a resonance device shown in FIG. 23.

FIG. 23 is a perspective view of a resonance device according to yet another embodiment of the present invention. FIG. 24 is a cross-sectional view of a resonance device shown in FIG. 23.

Referring to FIGS. 23 and 24, each of a plurality of conductive layers 1215-1 to 1215-4 included in a case 1210 of a resonance device 1200 may substantially have the same structure as the conductive layer 115 of FIG. 1.

The resonance device 1200 may include a crossing layer 1221 having an overlapping area which overlaps at least three conductive layers (for example, 1215-1 to 1215-3), and a plurality of open-ended layers 1223-1 and 1223-2 connected to the crossing layer 1221.

The crossing layer 1221 and the plurality of open-ended layers 1223-1 and 1223-2 may be spaced apart from the conductive layers (for example, 1215-1 to 1215-3) in a vertical direction.

The resonance device 1200 may increase frequency selectivity of a low frequency side among the pass band by adding a parallel capacitance component through the crossing layer 1221 and the plurality of open-ended layers 1223-1 and 1223-2.

According to an embodiment, the resonance devices 100 to 1200 of FIGS. 1 to 24 may be implemented as a band pass filter.

The device according to embodiments of the present invention can decrease sensitivity when designing the characteristics of the resonance device by including the conductive layer configured as the main part and the protruding part having a width different from that of the main part.

That is, the characteristics of the resonance device can be easily designed by adjusting the width and the protruding length of the protruding part and the distance between the protruding part and the second ground surface.

The present invention was described with reference to embodiments shown in the accompanying drawings, but, they are merely exemplary embodiments. It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

The invention claimed is:

1. A resonance device, comprising:
a case having a first ground surface and a second ground surface which are facing each other; and
a first conductive layer located in the case;
a first stacked layer which is grounded via the second ground surface, is spaced apart from the first conductive layer, and is disposed above the first conductive layer;
a second stacked layer which is grounded via the second ground surface, is spaced apart from the first conductive layer, and is disposed below the first conductive layer; and
a second conductive layer which is grounded via the first ground surface, has the same structure as the first conductive layer, and is disposed between the first conductive layer and the second stacked layer,
wherein the first conductive layer includes:
a main part grounded via the first ground surface,
a protruding part which has a width different from that of the main part and is located to be spaced apart from the second ground surface; and
wherein the protruding part of the first conductive layer and a protruding part of the second conductive layer are connected by a via.

2. The resonance device of claim 1, wherein characteristics of the resonance device are determined according to the width and a protruding length of the protruding part of the first conductive layer, and a distance between the protruding part and the second ground surface.

3. A band pass filter including the resonance device of claim 1.

4. The resonance device of claim 1, wherein the first stacked layer is spaced apart from each of the main part and the protruding part of the first conductive layer in a first direction, and the first stacked layer has an overlapping area with the main part and the protruding part of the first conductive layer in the first direction.

5. The resonance device of claim 1, further comprising:
a third stacked layer which is not grounded via the second ground surface, is disposed above the first stacked layer, and is connected to the protruding part of the first conductive layer by a first via; and
a fourth stacked layer which is not grounded via the second ground surface, is disposed below the second stacked layer, and is connected to the protruding part of the first conductive layer by a second via.

6. The resonance device of claim 1, wherein the second stacked layer is spaced apart from each of the main part and the protruding part of the first conductive layer in a second direction, and the second stacked layer has an overlapping area with the main part and the protruding part of the first conductive layer in the second direction.

* * * * *